United States Patent
Lee et al.

(10) Patent No.: US 6,346,895 B1
(45) Date of Patent: Feb. 12, 2002

(54) APPARATUS AND METHOD FOR USING NIBBLE INVERSION CODE

(75) Inventors: Bhum-Cheol Lee, Taejon; Jong-Moo Sohn, Puchon-si; Eun-Chang Choi; Kwon-Chul Park, both of Taejon, all of (KR)

(73) Assignees: Electronics and Telecommunications Research Institute; Korea Telecom, both of (KR)

( * ) Notice: Subject to any disclaimer, the term of this patent is extended or adjusted under 35 U.S.C. 154(b) by 0 days.

(21) Appl. No.: 09/769,099

(22) Filed: Jan. 24, 2001

(30) Foreign Application Priority Data

Oct. 10, 2000 (KR) ........................................ 2000-59462

(51) Int. Cl.[7] .............................................. H03M 5/00
(52) U.S. Cl. .............................. 341/58; 341/68; 341/69; 341/59
(58) Field of Search .............................. 341/50, 55, 68, 341/69, 58

(56) References Cited

U.S. PATENT DOCUMENTS

| | | | | |
|---|---|---|---|---|
| 4,438,427 A | * | 3/1984 | Miura ........................ | 340/347 |
| 4,486,739 A | * | 12/1984 | Franaszek et al. .......... | 340/347 |
| 4,786,890 A | * | 11/1988 | Marcus et al. ................ | 341/81 |
| 4,965,576 A | * | 10/1990 | Watanabe et al. ............. | 341/94 |
| 5,151,699 A | * | 9/1992 | Moriyama ................... | 341/58 |
| 5,200,979 A | * | 4/1993 | Harris .......................... | 375/19 |
| 5,387,911 A | * | 2/1995 | Gleichert et al. ............. | 341/95 |
| 5,450,443 A | * | 9/1995 | Siegel et al. ................ | 375/286 |
| 5,506,581 A | * | 4/1996 | Ino et al. ...................... | 341/58 |
| 5,699,062 A | * | 12/1997 | Widmer ........................ | 341/58 |
| 5,764,169 A | * | 6/1998 | Toguchi ....................... | 341/68 |
| 5,805,087 A | * | 9/1998 | Walker ......................... | 341/95 |
| 5,974,464 A | * | 10/1999 | Shin et al. ................... | 709/231 |
| 6,188,337 B1 | * | 2/2001 | Soljanin ....................... | 341/59 |
| 6,198,413 B1 | * | 3/2001 | Widmer ....................... | 341/59 |

OTHER PUBLICATIONS

Interfaces for Digital Component Video Signals in 525–Line and 625–Line Television Systems; Information Handling Services, Sep. 1, 2000; pp.*
A DC–Balanced, Partitioned–Block, 8B/10B Transmission Code, A.X. Widmer et al., IMB J. Res. Develop. vol. 27, No. 5 Sep. 1983; pp. 440–451.*
Transmission Performance Analysis of a New Class of Line Codes for Optical Fiber Systems; Witold A. Krzymien; IEEE Transactions on Communication, vol. 37, No. 4.*
DmB1M code and its Performance in a very High–speed optical transmission system; S. kawanishi, IEEE Transmissions on Communications, vol. 36, No. 8, Aug. 1998.*

* cited by examiner

Primary Examiner—Michael Tokar
Assistant Examiner—Nguyen Khai
(74) Attorney, Agent, or Firm—Blakely Sokoloff Taylor & Zafman

(57) ABSTRACT

A method for using a nibble(partial bits of word) inversion code in a network system includes the steps of: a) adding 1 redundancy bit to n bit source data and generating a pre-code, n being an even number of 2 or over; b) deciding the number of transitions in the generated pre-code; c) determining the pre-code as a code word if the number of transitions in the pre-code is greater than or equal to 1+n/2 in a deciding result; d) inverting alternate bits including the redundancy bit among bits constructing the pre-code and generating the code word, if the number of transitions in the pre-code is less than n/2 in the deciding result; e) determining the pre-code as the code word in case that the number of transitions in the pre-code is equal to n/2 and simultaneously the source data is not an in-band signaling and not a special word in the deciding result; and f) inverting the nibble among the bits constructing the pre-code and generating the code word, in case that the number of transitions in the pre-code is equal to n/2 and simultaneously the source data is an in-band signaling or is a special word in the deciding result.

11 Claims, 4 Drawing Sheets

APPARATUS AND METHOD FOR USING NIBBLE INVERSION CODE

FIELD OF THE INVENTION

The present invention relates to an apparatus and method for using a nibble (partial bits of word) inversion code; and, more particularly, to an apparatus and method for using a code with controlled transition for a data transmission and an interconnection in a network system.

DESCRIPTION OF THE PRIOR ART

The Manchester code, the code mark inversion(CMI) code and the 5B6B code were widely used as transmit line code in digital transmission systems. However, these codes are not suitable for very high speed communication systems since they require a baud rate twice as fast as the source bit rate, and it is difficult to develop transmission equipment to operate at such rates. Also these codes were not suitable for interconnection with Giga-bit rate since the codes are generated bit by bit.

In a transmission field of the communication, a scrambled NRZ(Non-Return-to-Zero) code is being widely used to solve such problems and maximize a code efficiency. This code has an effect of reducing a cross-talk and an interference by spreading the spectrum of data coded by randomizing probability of source data. But, the scrambled NRZ code only ensures zero probability of disparity, zero direct current(DC) frequency component and spread spectrum, in other words, the scrambled NRZ code does not perfectly guarantee them, and it does not provide a frame synchronous pattern and an in-band signaling words.

In a computer network, in order to solve such problems, the 8B10B code is invented in "Byte oriented DC balanced 8B10B partitioned block transmission code" of U.S. Pat. No. 4,486,739 by P. A. Franaszek and A. X. Widmer. The 8B10B coder is performed on an octet basis. This code provides DC-balanced encoding, frame synchronous patterns and in-band signaling (or special) words.

However, though the 8B10B code has settled many problems caused in the above-mentioned codes, there is a problem that 8B10B coding scheme must be completely changed to encode a source data (for example 32 bit source data) other than 8 bit source data. Further, since 2 redundant bits are added to 8 bits constructing the byte of the source data to perform a coding, it is less efficient thus cause a problem that a transmission bandwidth becomes large.

W. A. Krzymein had proposed the "Partially flipped mB(m+1)B" code in IEEE Trans. Commun., Vol. 37, No. 4, pp. 402–404 of "Transmission performance analysis of a new class of line codes for optical fiber systems" in April 1989. In this code, a m+1 bit code word is produced by inserting a 1 redundancy bit into a source data character of an m bit. In this code, also, the coding is performed by using a disparity of a source data word as a code parameter and a running digital sum (RDS). In this code, a code efficiency is acceptable and its embodying is comparatively simple. But, there is a problem that a synchronous signal and in-band and ex-band signals can not be provided. There is further such a problem that a coding efficiency in a disparity, a digital sum variation (DSV) and a run length is low compared to a complicated extent of an embodying hardware.

At these days, Yeshik Shin and two others had disclosed a code in which the code efficiency is acceptable, an embodying thereof is simple, and its use is valid with 8bits and other words, in the U.S. Pat. No. 5,974,464 as "System for high speed serial video Signal transmission using DC balanced coding" in Oct. 26, 1999. In this prior art, however, there are some shortcoming that the number of transitions for the in-band signals(command) is small and the length of bits for the frame synchronous patterns is long.

It will be not explained in the following detailed description of the invention on account of a small relation to this technical field and limited space, but in a serial connection of a high-speed over a giga bit, a DC component of a line code does not become a serious problem, but a bandwidth based on the number of transitions and the code efficiency does rather become a problem. Further, when a serial bit stream is changed to a parallel in high speed, the number of parallel bits becomes over 8bits, thus there is a problem of requiring a code easily applicable to data having bits over 8bits.

SUMMARY OF THE INVENTION

Therefore, an object of the present invention is to provide an apparatus and method for using a nibble inversion code in which an inversion for partial bits (hereinafter, referred to as 'nibble') of the pre-code is decided by the number of transitions in a pre-code generated by adding a redundancy bit to source data, to provide high transition, in-band signaling and a block or a frame synchronization pattern.

In accordance with the present invention for achieving the objects, an apparatus for using a nibble inversion code to utilize a nibble inversion comprises first a transition number calculation unit for summing up the number of transitions for a pre-code generated by adding 1 redundancy bit to source data; an encoding type decoding unit for selecting a code type based on nibble inversion coding rules according to an in-band signaling and the transition number of the pre-codes generated from the first transition number calculating unit, and producing a control signal; and a bit manipulating unit for selecting a nibble inversion code type according to the control signal of the encoding type decoding unit, manipulating a bit and generating a code word.

In accordance with the present invention, another apparatus to receive a generated nibble inversion code word and decode source data includes; a transition number calculating unit for computing the number of transitions in the received code word; a decoding type decoding unit for generating a signal which selects a decoding type based on decoding rules of a nibble inversion code according to a nibble inversion representation bit provided within the code word, an in-band signaling or a special word SIG_OUT, and a code violation CODE_VIOLATION; and a bit manipulating unit for manipulating bits in the code word through a selection signal transferred from the decoding type decoding unit, and restoring original source data.

In a first method of the present invention, a method for using a nibble inversion code in a network system includes a first step of adding 1 redundancy bit to n bit source data and generating a pre-code, n being an even number of 2 or over; a second step of deciding the number of transitions in the generated pre-code; a third step of determining the pre-code as a code word if the number of transitions in the pre-code is greater than or equal to 1+n/2 in the result of the second step; a fourth step of inverting half bits (hereinafter, referred to as "nibble") containing the redundancy bits among bits constructing the pre-code, and generating the code word, if the number of transitions in the pre-code is less than n/2 in the result of the second step; a fifth step of determining the pre-code as the code word in case that the number of transitions in the pre-code is equal to n/2 and simultaneously the source data is not an in-band signaling nor a special word in the deciding result of the second step; and a sixth step of inverting the nibble among the bits constructing the pre-code and generating the code word, in case that the number of transitions in the pre-code is equal to n/2 and simultaneously the source data is the in-band signaling or is the special word in the deciding result of the second step.

In a second method of the present invention, a method for using a nibble inversion code in a network system to receive a code word generated through a nibble inversion of n bit source data and to decode the source data, n being an even number of 2 or over includes a first step of confirming the number of transitions in the received code word; a second step of decoding the source data to bits except redundancy bits in the code word, if the number of transitions for the code word is greater than or equal to 1+n/2 and simultaneously the redundancy bit is not inverted in the confirming result of the first step; a third step of inverting a nibble constructing the code word and decoding the source data to the bits except the redundancy bits of the nibble inverted code word, if the number of transitions for the code word is greater than or equal to 1+n/2 and simultaneously the redundancy bit is inverted in the confirming result of the first step; a fourth step of decoding the source data to the bits except the redundancy bits of the code word if the number of transitions for the code word is equal to n/2 and simultaneously the redundancy bit is not inverted in the confirming result of the first step; a fifth step of inverting the nibble constructing the code word, decoding the source data to the bits except the redundancy bits of the nibble inverted code word, and representing that the decoded source data is an in-band signaling or a special word, if the number of transitions for the code word is equal to n/2 and simultaneously the redundancy bit is not inverted in the confirming result of the first step; and a sixth step of representing a signal violation if the number of transitions for the code word is smaller than n/2 in the confirming result of the first step.

In a third method of the present invention, a method for using a nibble inversion code in a network system contains a first step of adding 1 redundancy bit to n bit source data and generating a pre-code, n being an odd number of 3 or over; a second step of deciding the number of transitions in the generated pre-code; a third step of determining the pre-code as a code word if the number of transitions in the pre-code is greater than or equal to (n+1)/2 in the deciding result of the second step; a fourth step of inverting half bits (hereinafter, referred to as "nibble") containing the redundancy bits among bits constructing the pre-code, and generating the code word, if the number of transitions in the pre-code is less than (n−1)/2 in the deciding result of the second step; a fifth step of determining the pre-code as the code word in case that the number of transitions in the pre-code is equal to (n−1)/2 and simultaneously the source data is not an in-band signaling and also is not a special word in the deciding result of the second step; and a sixth step of inverting the nibble among the bits constructing the pre-code and generating the code word, in case that the number of transitions in the pre-code is equal to (n−1)/2 and simultaneously the source data is the in-band signaling or is the special word in the deciding result of the second step.

In a fourth method of the present invention, a method for using a nibble inversion code in a network system to receive a code word generated through a nibble inversion of n bit source data and to decode the source data, n being an odd number of 3 or over includes a first step of confirming the number of transitions in the received code word; a second step of decoding the source data to bits except redundancy bits in the code word, if the number of transitions in the code word is greater than or equal to (n+1)/2 and simultaneously the redundancy bit is not inverted in the confirming result of the first step; a third step of inverting a nibble constructing the code word and decoding the source data to the bits except the redundancy bits of the nibble inverted code word, if the number of transitions in the code word is greater than or equal to (n+3)/2 and simultaneously the redundancy bit is inverted in the confirming result of the first step; a fourth step of decoding the source data to the bits except the redundancy bits of the code word if the number of transitions in the code word is equal to (n−1)/2 and simultaneously the redundancy bit is not inverted in the confirming result of the first step; a fifth step of inverting the nibble constructing the code word, decoding the source data to the bits except the redundancy bits of the nibble inverted code word, and representing that the decoded source data is an in-band signaling or a special word, if the number of transitions in the code word is equal to (n+1)/2 and simultaneously the redundancy bit is inverted in the confirming result of the first step; and a sixth step of representing a signal violation if the number of transitions in the code word is smaller than (n−1)/2 in the confirming result of the first step.

The present invention provides a line code used in a data transmission and an interconnection system, and in this line code, a clock recovery is easy, only one redundancy bit is used in encoding, several frame synchronization code words are provided, plenty of in-band signals are provided, and a basis of code rules can be applied thereto as it is even though a source data word is constructed by bits beyond 8bits thus this line code is appropriate to an application of a serial connection with a speed over a giga bit.

In the inventive apparatus and method for using a nibble inversion code to settle the problems caused in the conventional techniques, a transition is ensured, only 1 bit is used as a redundancy bit in a line coding for an optional n bit source data, n being the number of bits for source data, several numbers of frame synchronization patterns are provided, the in-band signals are provided plentifully, a bit error on a line can be detected by a code violation detection, and it can be simply embodied by a hardware.

In the invention, it is provided a high-performance line code usable even in a transmission system over a giga bit speed and interconnection apparatus, and herein, a clock recovery is especially easy, a code efficiency and a transmission bandwidth are improved by using only one redundancy bit in encoding, a basis of the coding or decoding rules can be applied thereto as it is even though the source data is constructed by bits beyond 8bits, namely, 16 bits, or 32 bits or over, several numbers of frame synchronization code words are provided, and the in-band signals are provided abundantly.

In the inventive coding rule, a pre-code is generated by adding 1 redundancy bit for n bit source data, n being a natural number of 2 or over, and the number of transitions in a code word becomes plentiful by inverting a nibble of bits which construct the pre-code according to the number of transitions in the pre-code or by coding the pre-code as it is, and then the source data, an independent in-band signal and a block or a frame synchronization pattern are generated. The inventive decoding rules are a reverse of the coding rules.

BRIEF DESCRIPTION OF THE DRAWINGS

The above and other objects and features of the instant invention will become apparent from the following description of preferred embodiments taken in conjunction with the accompanying drawings, in which.

PREFERRED EMBODIMENT OF THE INVENTION

Hereinafter, preferred embodiments of the present invention will be described in detail with reference to the accompanying drawings.

Figure 1:
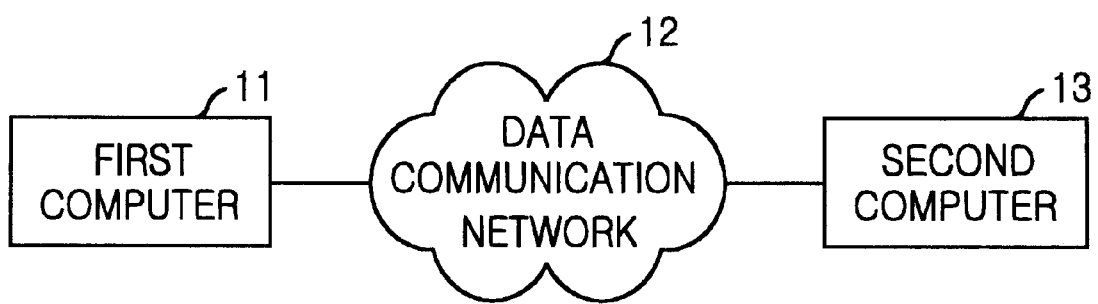
FIG. 1 represents a constructive exemplary diagram of a network system in accordance with the present invention.

FIG. 1 is a constructive exemplary diagram of a network system in accordance with the present invention.

As shown in the drawing, the inventive network system includes a first computer 11, a data communication network 12 and a second computer 13.

In case that data is transmitted in the first computer 11 or the second computer 13, the transmission is gotten by coding the data as a nibble inversion code, and in a case of its reception, a decoding for the nibble inversion code is performed.

Figure 2:
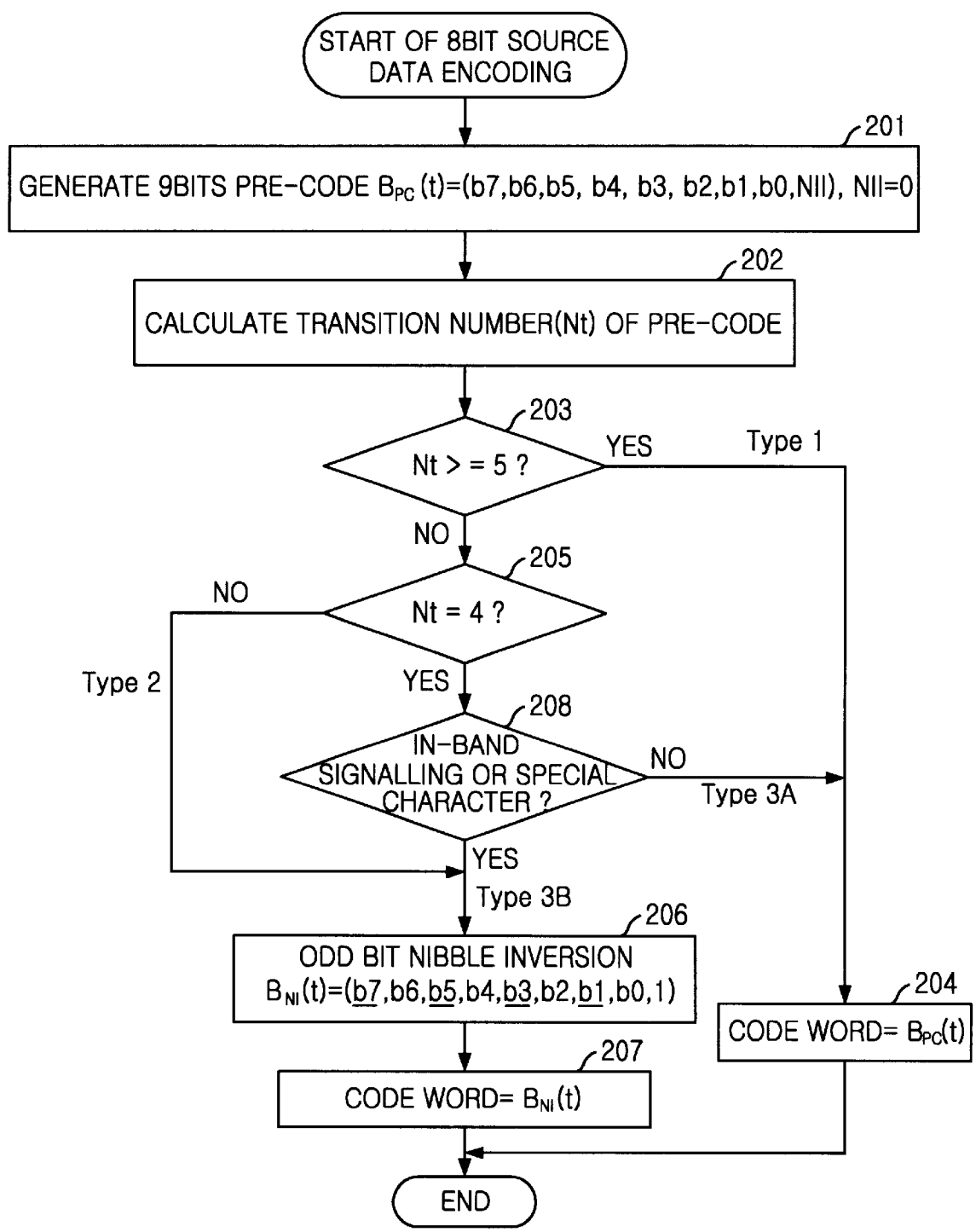
FIGS. 2 and 3 illustrate flow charts for one embodiment in a method for using a nibble inversion code in the present invention.
Figure 3:
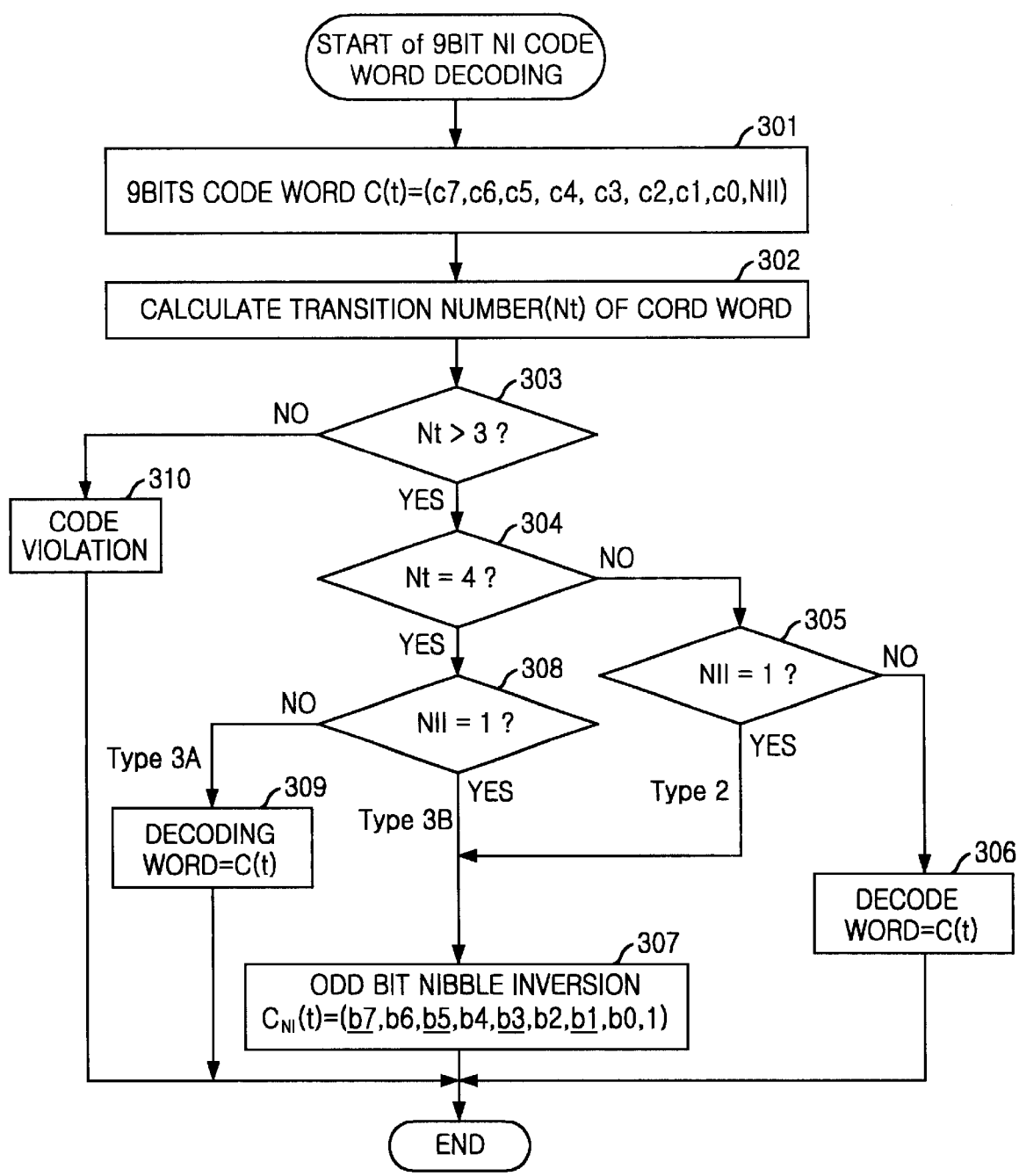

FIGS. 2 and 3 are flow charts for a method for using a nibble inversion code in one embodiment of the present invention.

A nibble inversion code (NI) for a case of source data as 8 bits is first described in the following to make it easy to understand the inventive construction and operation and compare with codes practiced to an application of a conventional 8 bit unit.

FIG. 2 describes a coding on the basis of nibble inversion coding rules in a unit of 8bits. Data input for a transmission is coded according to the nibble inversion coding rules as shown in FIG. 2.

The source data is an 8 bits word and a coded code word is a 9 bits character. A pre-code code of 9 bits is generated by adding a nibble inversion indication (NII) bit to a character constructed by b(7:0) at a position next to a least significant bit (LSB) of 8 bit word, wherein b(7:0) indicates b7, b6, b5, b4, b3, b2, b1, b0. That is, in generating the pre-code constructed with b7, b6, b5, b4, b3, b2, b1, b0 and NII(NII=0), where b7 is a most significant bit(MSB), and NII is a new least significant bit. An odd bit nibble is b7, b5, b3, b1 and NII and an even bit nibble is b6, b4, b2 and b0.

The odd bit nibble inversion takes a complement of the odd bit nibble, in other words, it means that b7, b6, b5, b4, b3, b2, b1, b0 and NII are generated, b7 being a complement of b7.

The NI coding is performed differently by 4 types. Coding rules based on the NI coding type for the source data is described as follows. An Nt mentioned in the following represents a transition number for the pre-code.

If Nt>=5, the pre-code intact is generated as a code word (Type 1).

If Nt<4, a nibble inverted pre-code is generated as the code word (type 2).

If Nt=4 and also it is not an in-band signaling nor special word, the pre-code is generated as the code word, as it is, (Type 3A).

This is described according to a flow shown in the drawing, as follows.

It is first requested a coding for the 8 bits source data. The pre-code of 9 bits (Bpc(t)=b7, b6, b5, b4, b3, b2, b1, b0, NII(NII=0)) is generated on the basis of the input source data in a step 201.

In a step 202, the number of transitions (Nt) for the generated pre-code is checked.

It is decided in a step 203 whether or not the number of transitions (Nt) for the checked pre-code is greater than or equal to 5.

If it is greater than or equal to 5 in the deciding result of the step 203, it corresponds to the type 1 and the pre-code of 9 bits is regarded as a code word to be transmit in a step 204.

If it is not greater than or equal to 5 in the result of the decision whether the Nt number of the pre-code is more than or equal to 5, it is checked in a step 205 whether or not the Nt of the pre-code is 4.

If it is not 4 in the checking result whether or not the Nt of the pre-code is 4, it corresponds to the type 2 and the odd bit nibble inversion is performed as (BNI(t)=b7, b6, b5, b4, b3, b2, b1, b0, 1) in a step 206, and the code word to be transmitted is provided as the odd bit nibble inverted code as BNI(t) in a step 207.

If it is 4 in the result of the checking whether the Nt of the pre-code is 4, it is checked in a step 208 whether or not the input source data is the in-band signaling or special character.

If it is not the in-band signaling nor special character in the checking result of the step 208, it corresponds to a type 3A and the generated 9bit pre-code BPC(t) is provided as the code word to be transmitted in the step 204.

If it is the in-band signaling or special character in the result of checking whether or not the source data is the in-band signaling or special character, it corresponds to a type 3B and the odd bit nibble inversion is performed as (BNI(t)=b7, b6, b5, b4, b3, b2, b1, b0, 1) in the step 206, and the code word to be transmitted is provided as the odd bit nibble inverted code as BNI(t) in the step 207.

In case that the coding is performed as above for the source data of an N bit, N being an even number, a code word with n+1 bits is generated and this code word always has n/2 or more transitions. The reason is that the n−r transitions are generated when the nibble of the pre-code is inverted in case that the number of transitions in the pre-code has the r transitions which is smaller than n/2.

There may exist 256(2^8) characters for the source data of the 8bits character, and the code words generated by the NI coding rules may be classified according to respective code types as follows. The number of codes in a case of Type 1(Nt>=5) is 93 as 8!/8!0!+8!/7!1!+8!/6!2!+8!/5!3!, and the number of codes in a case of Type 2(Nt<4) is 93 as 8!/8!0!+8!/7!1!+8!/6!2!+8!/5!3!, and also in a case of Type 3A(Nt=4 and a data), its number is 70 as 8!/4!4!. In a case of Type 3B(Nt=4 and a special character), the number of code words is 70 as 8!/4!4!.

The NI code provides a synchronization character or a code word for a frame synchronization or a block synchronization. The synchronization code word provides a bit stream pattern unique in a serial bit stream. Since the NI code word of 9bits ensures the transitions of 4 or over, the unique bit pattern can be obtained as follows. A combination of the code word having a unique and also shortest(10bits) pattern (0000000000 or 1111111111), when two code words with 4 transitions are consecutive, is 010100000000001010 or 101011111111110101.

Unfortunately, the unique pattern in the nibble inversion code word is not generated in one code word, but can be generated in consecutive two code words (010100000 and 000001010, 101011111 and 111110101 etc. ). Such combination of code words can be easily gained by a pattern matching program using the computer, and when a synchronization pattern length becomes prolonged, more various synchronization characters can be generated. In order to easily process synchronization code words, it is desirable to select a pattern gained by combining a special code word and an optional code word or an in-band signaling among several numbers of unique patterns found out by the computer. When the bit number in the synchronization pattern becomes large, e.g., 10bits, 11bits, 12bits, etc., the number of synchronization patterns becomes many.

An NI code-book for the 8bit source data is provided in the following [Table 1].

TABLE 1

| Combination of synchronization characters for in-band signaling or special word | | 11 bits synchronization |
| --- | --- | --- |
| First [source data] code word | second [source data] code word | pattern bit format of synchronization pattern |
| [i010]101<u>000001</u> | [i080]<u>111110</u>101 | 00000111111 |
| [i011]101<u>000011</u> | [i080]<u>111110</u>101 | 00001111111 |
| [i009]101<u>000111</u> | [i080]<u>111110</u>101 | 00011111111 |
| [i013]101<u>001111</u> | [i080]<u>111110</u>101 | 00111111111 |
| [i005]101<u>011111</u> | [i080]<u>111110</u>101 | 01111111111 |
| [i005]101<u>011111</u> | [i040]<u>100000</u>101 | 11111100000 |
| [i005]101<u>011111</u> | [i104]<u>110000</u>101 | 11111110000 |
| [i005]101<u>011111</u> | [i072]<u>111000</u>101 | 11111111000 |
| [i005]101<u>011111</u> | [i088]<u>111100</u>101 | 11111111100 |
| [i005]101<u>011111</u> | [i080]<u>111110</u>101 | 11111111110 |

In the above [Table 1], a digit within [ ] indicates the 8bit source data represented as a decimal number, and i within [ ] provides the in-band signaling. For instances, [i010] represents the in-band signaling of 00001010 source data.

Underlined bits in the code word indicate bits used in the synchronization pattern.

The synchronization code constructed by the special character for the synchronization pattern of 11 bits is represented when the 8bit source data in the above [Table 1] is NI-coded. The coding rules for the synchronization code word is described as follows.

When Nt=4 and also a special character, and two special characters are consecutive, two special characters with the unique pattern are used.

Describing an NI code performance for the 8 bit source data, when the 8bit source data generates the code word and provides the synchronization pattern of Table 1 according to the NI coding rules mentioned above, the maximum run length of 1 or 0 is 10, 70 (8!/4!4!) in-band signals are provided, and 11bit synchronization patterns as a synchronization code word pair by 10 in its number are provided. The [Table 1] represents the synchronization pattern constructed by 11 bits for the 8bits source data, as the synchronization code word pair.

FIG. 3 shows a decoding performed on the basis of the nibble inversion decoding rules in a unit of 8 bits. As shown in FIG. 3, the transmitted data is decoded by the nibble inversion decoding rules. In order to make it more comprehensive and to compare with the conventional code in describing the decoding rules, the NI decoding is explained for a case of 8 bits source data in the following.

The NI decoding rule is a reverse of the NI coding rule. A code word is constructed by c7, c6, c5, c4, c3, c2, c1, c0 and NII. The code word is divided into an odd bit nibble and the an even bit nibble, wherein the odd bit nibble is provided as c7, c5, c3, c1, and NII and the even bit nibble is provided as c6, c4, c2 and c0. An odd bit nibble inversion takes complements of the odd bit nibble, which means a generation of <u>c7, c5, c3, c1 and NII, c7</u> being a complement of c7.

The decoding rules based on the NI code type is described as follows.

If Nt>=5 and also NII=0, NII is eliminated from code words, then it is restored to source word (Type 1).

If Nt>=5 and also NII=1, the code word is nibble-inverted to remove the NII and to be thus restored to the source word (Type 2).

If Nt=4 and also NII=0, the code word is restored to the source word by removing the NII from the code words (Type 3A).

If Nt=4 and also NII=1, the code word is nibble-inverted to eliminate the NII so as to be restored to the source word, wherein the source word is an in-band signaling or a special word (Type 3B).

If Nt<4, it is an error signal violated to the code rules.

The synchronization code word is detected with the unique synchronization pattern from the serial or parallel block stream.

This is described referring to a flow shown in the drawing, as follows.

A 9bits nibble inversion code word as C(t)=(c7, c6, c5, c4, c3, c2, c1, c0, NII) is received in a step 301, and the number of transitions (Nt) in a code word is calculated and checked in a step 302.

It is checked in a step 303 whether or not the transition number Nt for the checked code word is greater than 3.

If the transition number Nt for the code word is not greater than 3 in the checking result of the step 303, it is a code violation for an mistaken transmission code in a step 310 since the transition number (Nt) for the transmitted code word is regulated so as to become 4 or over.

In the result of checking whether the Nt for the code word is greater than 3, if the Nt for the code word is greater than 3, it is clarified in a step 304 whether or not the Nt for the code is 4.

If Nt is 4 in the result of checking whether the Nt for the code is 4, it is decided in a step 308 whether the nibble inversion indication (NII) bit is 1.

If the NII bit is not 1 in the result of deciding whether the NII bit is 1, it corresponds to the type 3A and the decoding is performed by removing the NII bit from the code word since the code word is provided by coding the pre-code as it is, in a step 309.

If the NII bit is 1 in the result of deciding whether the NII bit is 1, it corresponds to the type 3B and the decoding is gained by performing the odd bit nibble inversion as CNT (t)=(<u>b7</u>, b6, <u>b5</u>, b4, <u>b3</u>, b2, <u>b1</u>, b0, 1) on the code word and removing the NII bit from the code word since the code word is provided by executing the odd bit nibble inversion on the pre-code, in a step 307.

If Nt for the code word is not 4 in the result of checking whether the Nt for the code is 4, it is checked in a step 305 whether the NII bit is 1.

If the NII bit is 1 in the result of checking whether the NII bit is 1, it corresponds to the type 2 and the decoding is gained by performing the odd bit nibble inversion as CNT (t)=(b7, b6, b5, b4, b3, b2, b1, b0, 1) on the code word and removing the NII bit from the code word since the code word is provided by executing the odd bit nibble inversion for the pre-code, in the step 307.

If the NII bit is not 1 in the result of checking whether the NII bit is 1, it corresponds to the type 1 and the decoding is gained by just removing the NII bit from the code word since the code word is provided by coding the pre-code as it is, in a step 306.

Subsequently, in order to widen an application range provided as the best merit in the inventive code, it is described in the following a nibble inversion code for a case If Nt=8 and also it is the in-band signaling or a special word, the nibble-inverted pre-code is generated as the code word (Type 3B)

Like the case of the 8bit source word, in order to easily process the synchronization code word, it is desirable to select a pattern gained by combining the in-band signaling or a special code word and an optional code word among several unique patterns found out by the computer. [Table 2] indicates the synchronization code constructed by the special characters for the synchronization pattern of 19bits provided in NI-coding 16bits source data.

TABLE 2

| Combination of in-band signaling or special word | | 19bit synchronization pattern |
|---|---|---|
| First [source data] code word | Second [source data] code word | Bit format of synchronization pattern |
| [i00170]10101010<u>000000001</u> | [i21760]<u>1111111</u>101010101 | 0000000001111111111 |
| [i00171]10101010<u>000000011</u> | [i21760]<u>1111111</u>101010101 | 0000000011111111111 |
| [i00169]10101010<u>000000111</u> | [i21760]<u>1111111</u>101010101 | 0000000111111111111 |
| [i00173]10101010<u>000001111</u> | [i21760]<u>1111111</u>101010101 | 0000001111111111111 |
| [i00165]10101010<u>000011111</u> | [i21760]<u>1111111</u>101010101 | 0000011111111111111 |
| [i00181]10101010<u>000111111</u> | [i21760]<u>1111111</u>101010101 | 0000111111111111111 |
| [i00149]10101010<u>001111111</u> | [i21760]<u>1111111</u>101010101 | 0001111111111111111 |
| [i00213]10101010<u>011111111</u> | [i21760]<u>1111111</u>101010101 | 0011111111111111111 |
| [i00085]10101010<u>111111111</u> | [i21760]<u>1111111</u>101010101 | 0111111111111111111 |
| [i00085]10101010<u>111111111</u> | [i10880]<u>1000000000</u>1010101 | 1111111111000000000 |
| [i00085]10101010<u>111111111</u> | [i27264]<u>1100000000</u>1010101 | 1111111111100000000 |
| [i00085]10101010<u>111111111</u> | [i19072]<u>1110000000</u>1010101 | 1111111111110000000 |
| [i00085]10101010<u>111111111</u> | [i23168]<u>1111000000</u>1010101 | 1111111111111000000 |
| [i00085]10101010<u>111111111</u> | [i21120]<u>1111100000</u>1010101 | 1111111111111100000 |
| [i00085]10101010<u>111111111</u> | [i22144]<u>1111110000</u>1010101 | 1111111111111110000 |
| [i00085]10101010<u>111111111</u> | [i21632]<u>1111111000</u>1010101 | 1111111111111111000 |
| [i00085]10101010<u>111111111</u> | [i21880]<u>1111111100</u>1010101 | 1111111111111111100 |
| [i00085]10101010<u>111111111</u> | [i21760]<u>1111111110</u>1010101 | 1111111111111111110 | that source data is constructed by 16bits which is a half of 32 bits word that is widely used in the parallel giga bit interconnection. In this case, when the 32 bits word is divided into two code blocks to perform the coding, the 32 bits source data is coded into a 34 bits code word.

The source data is a 16bits word and the coded code word is a 17bits character. The pre-code of 17 bits is generated by adding the nibble inversion indication (NII) bit to a position next to a least significant bit (LSB) of a character in the word constructed by b(15:0), b(15:0) representing b15, b14, b13, b12, b11, b10, b9, b8, b7, b6, b5, b4, b3, b2, b1 and b0. That is, in generating the pre-code constructed by b15, b14, b13, b12, b11, b10, b9, b8, b7, b6, b5, b4, b3, b2, b1, b0, and NII(NII=0), b15 is the most significant bit (MSB) and NII is a new least significant bit. In the odd bit nibble inversion, it means to take a complement for the odd bit nibble and a generation of b15, b14, b13, b12, b11, b10, b9, b8, b7, b6, b5, b4, b3, b2, b1, b0 and NII, wherein b15 is a complement of b15. The NI coding is performed by four kinds of types mainly. The coding rules based on the NI coding type are described as follows.

If Nt>=9, the pre-code intact is generated as the code word (Type 1).

If Nt<8, the nibble-inverted pre-code is generated as the code word (Type 2).

If Nt=8 and also it is not the in-band signaling or a special word, the pre-code intact is generated as the code word (Type 3A).

In the above [Table 2], a digit within [ ] indicates the 16bit source data represented as a decimal number, and i within [ ] provides the in-band signaling.

Underlined bits in the code word indicate bits used in the synchronization pattern.

Coding rules for the synchronization code word is as follows.

When Nt=8 and it is a special character, and two special characters are consecutive, two special characters with the unique pattern are used.

When 16bit source data becomes the code word according to the NI coding rules as above, the maximum run length of 1 or 0 is 18, 12,870(16!/8!8!) in-band signals are provided, and 19bit synchronization patterns as a synchronization code word pair by 18 in its number are provided.

The NI decoding rule for 16 bits is a reverse of the NI coding rule like the case of the 8bit source data. A code word is constructed by c15, c14, c13, c12, c11, c10, c9, c8, c7, c6, c5, c4, c3, c2, c1, c0 and NII. The code word is divided into the odd bit nibble and the an even bit nibble, wherein the odd bit nibble is provided as c15, c13, c11, c9, c7, c5, c3, c1 and NII, and the even bit nibble is provided as c14, c12, c10, c8, c6, c4, c2 and c0.

The odd bit nibble inversion represent to take complements of the odd bit nibble and a generation of c15, c13, c11, c9, c7, c5, c3, c1 and NII.

The decoding rules based on the NI code type for the 16bit source word is described as follows.

If Nt>=9 and also NII=0, NII is eliminated from the code word, then it is restored to the source word (Type 1).

If Nt>=9 and also NII=1, the code word is inverted by the odd bit nibble to remove the NII and to be thus restored to the source word (Type 2).

If Nt=8 and also NII=0, the code word is restored to the source word by removing the NII from the code words (Type 3A).

If Nt=8 and also NII=1, the code word is nibble-inverted to eliminate the NII so as to be restored to the source word, wherein the source word is an in-band signaling or a special word (Type 3B).

If Nt<8, it is a code violation.

The synchronization code word is detected with the unique synchronization pattern from the serial or parallel block stream.

Subsequently, in the inventive application to the code, it is described in the following a nibble inversion code for a case that source data is constructed by 32 bits so as to easily support a 32bit word often used in a parallel connection based on the giga bit interconnection.

The source data is the 32bits word and the coded code word is a 33bits character. The pre-code of 33 bits is generated by adding the nibble inversion indication (NII) bit to the position next to a least significant bit (LSB) of a character in the character constructed by b(31:0), b(31:0) representing b31, b30, b29, b28, b27, b26, b25, b24, b23, b22, b21, b20, b19, b18, b17, b16, b15, b14, b13, b12, b11, b10, b9, b8, b7, b6, b5, b4, b3, b2, b1 and b0. That is, in generating the pre-code constructed by b31, b30, b29, b28, b27, b26, b25, b24, b23, b22, b21, b20, b19, b18, b17, b16, b15, b14, b13, b12, b11, b10, b9, b8, b7, b6, b5, b4, b3, b2, b1, b0 and NII(NII=0), b31 is the most significant bit (MSB) and NII is a new least significant bit.

In the odd bit nibble inversion, it means to take a complement of the odd bit nibble and a generation of b31, b30, b29, b28, b27, b26, b25, b24, b23, b22, b21, b20, b19, b18, b17, b16, b15, b14, b13, b12, b11, b10, b9, b8, b7, b6, b5, b4, b3, b2, b1, b0 and NII, wherein b31 is a complement of b31. The NI coding is performed by four kinds of types mainly. The coding rules based on the NI coding type are described as follows.

If Nt>=17, the pre-code intact is generated as the code word (Type 1).

If Nt<16, the nibble-inverted pre-code is generated as the code word (Type 2).

If Nt=16 and also it is not the in-band signaling or a special word, the pre-code intact is generated as the code word (Type 3A).

If Nt=16 and also it is the in-band signaling or the special word, the nibble-inverted pre-code is generated as the code word (Type 3B).

Like the case of the 8bit source word, in the synchronization code word for a case of the 32 bit source word, the unique pattern is generated in a consecutive two code word so as to be generated as the special character. In order to easily process the synchronization code word like the case of 8bit source word, it is desirable to select a pattern by combining the in-band signaling or a special code word and an optional code word among several unique patterns found out by the computer.

When Nt=16 and it is the special character, and two special characters are consecutive, two special characters with the unique pattern are used.

When the 32 bit source data became the code word according to the NI coding rules, the maximum run length of 1 or 0 is 34, and 601,080,390(32!/16!16!) in-band signals are provided.

The NI decoding rules are a reverse of the NI coding rules like the case of the 8bit source data. The decoding rules based on the NI code type for the 32 bit source word is described as follows.

If Nt>=17 and also NII=0, NII is eliminated from the code word, then it is restored to the source word (Type 1).

If Nt>=17 and also NII=1, the code word is nibble-inverted to remove the NII and to be thus restored to the source word (Type 2).

If Nt=16 and also NII=0, the code word is restored to the source word by removing the NII from the code words (Type 3A).

If Nt=16 and also NII=1, the code word is nibble-inverted inverted to eliminate the NII so as to be restored to the source word, wherein the source word is the in-band signaling or the special word (Type 3B).

If Nt<16, it is the code violation.

The synchronization code word is detected with the unique synchronization pattern from the serial or parallel block stream.

As above-mentioned, the coding and decoding rules for the inventive code are not limited by the number of odd bits of the source data. Though it was described the case of the 8bit source data in the inventive construction and operation in order for more easy understanding and application of the invention, a generality for basic terms is not lost even though the NI coding rules for the source data with odd number of bits may have a change in a number of bits during a bit manipulation.

In the present invention, further, the nibble represents a half of the pre-code in which 1 bit is added to the source data, and is regardless of an odd bit nibble or an even bit nibble, wherein the half indicates an odd bit or an even bit. Though only the case of the even number n was described for convenience, the only difference between the cases of the even and odd number n is the transition numbers of in-band signaling, therefore a generality in the inventive code is not lost herein.

The following [Table 3A] provides a summary of the nibble inversion coding rules in a case of n as the even number, and [Table 3b] represents a summary of the nibble inversion decoding rules.

TABLE 3a

| Code laws (n=even number) | | Code word |
| --- | --- | --- |
| Condition | Type | code word generating |
| Nt>=1+n/2 | Type 1 | pre-code |
| Nt < n/2 | Type 2 | nibble-inverted pre-code |
| Nt = n/2 & data | Type 3A | pre-code |
| Nt = n/2 & in-band signal | Type 3B | Nibble-inverted pre-code |

TABLE 3b

| Decoding laws (n=even number) | | Decoding word |
| --- | --- | --- |
| Condition | Type | decoding word generating method |
| Nt>=1+n/2 & NII=0 | Type 1 | delete of NII bit from code word |
| Nt>=1+n/2 & NII=1 | Type 2 | delete of NII bit from nibble |
| Nt = n/2 & NII=0 | Type 3A | delete of NII bit from code word |
| Nt = n/2 & NII=1 | Type 3B | NII bit delete and in-band signaling representation in nibble- |

The inventive coding and decoding rules are respectively generalized and summarized for the source data constructed by even number n bits, through the above [Table 3A] and [Table 3B], and the following [Table 4A] and [Table 4B] individually provide the inventive coding and decoding rules generalized and summarized for the source data constructed by odd number n bits.

TABLE 4a

| Code laws (n=odd number) | | Code word |
|---|---|---|
| Condition | Type | code word generating method |
| Nt>=(n+1)/2 | Type 1 | pre-code |
| Nt < (n−1)/2 | Type 2 | nibble-inverted pre-code |
| Nt = (n−1)/2 & data | Type 3A | pre-code |
| Nt = (n−1)/2 & in-band | Type 3B | nibble-inverted pre-code |

TABLE 4b

| Decoding laws (n=odd number) | | Decoding word |
|---|---|---|
| Condition | Type | Decoding word generating method |
| Nt>=(n+1)/2 & NII=0 | Type 1 | NII bit delete from code word |
| Nt>=(n+3)/2 & NII=1 | Type 2 | NII bit delete from nibble- |
| Nt = (n−1)/2 & NII=0 | Type 3A | NII bit delete from code word |
| Nt = (n+1)/2 & NII=1 | Type 3B | NII bit delete and in-band signaling representation in |

Figure 4:
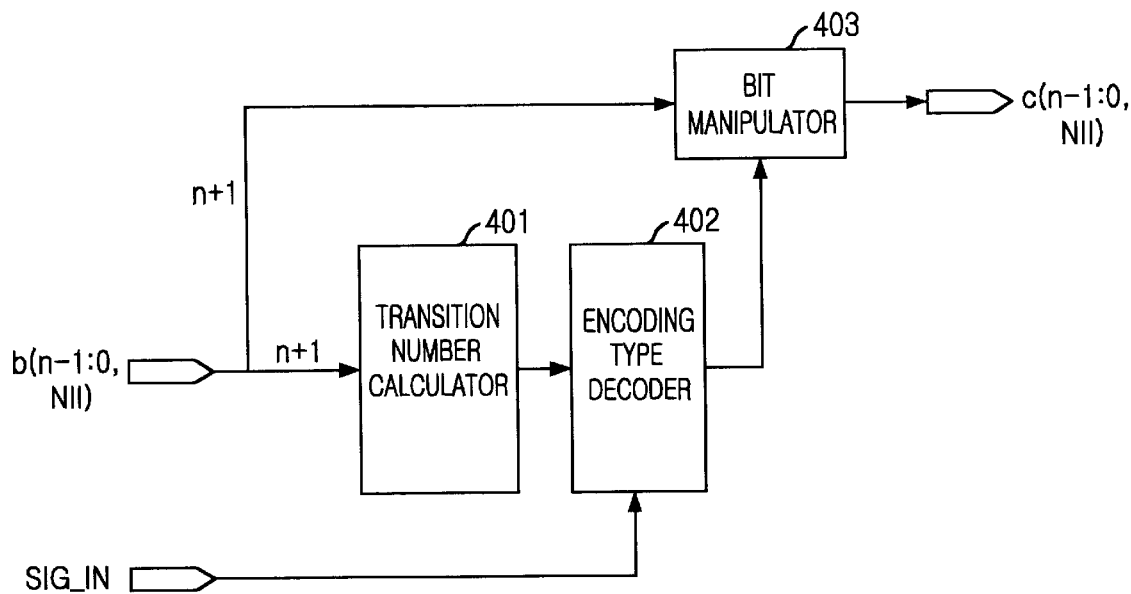
FIGS. 4 and 5 depict block diagrams for one embodiment in an apparatus for using a nibble inversion code in the invention.
Figure 5:
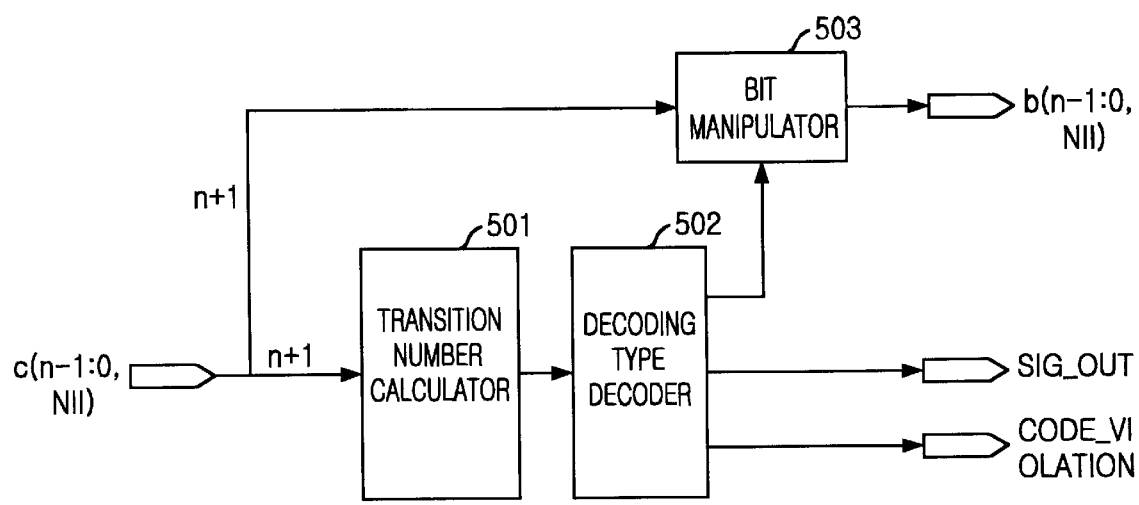

FIGS. 4 and 5 represent exemplary block diagrams of an apparatus for using the nibble inversion code in accordance with the present invention.

In FIGS. 4 and 5, there are described a coder and a decoder based on the above NI coding rules and the NI decoding rules.

Even though it is regarded that the inventive embodiment will be very complicated in the coding and decoding rules for the NI of FIGS. 2 and 3, its embodiment actually becomes simple since there respectively are symmetry and regularity in the NI coding and decoding rules. Though the NI coder and decoder are not restricted to the number of bits constructing the source data, an embodiment for hardware becomes complicated like all coders and decoders if the number of bits for the source data is many. In order to understand the inventive construction and operation more easily and so as to be easily supportable to widely used byte(8bits) unit application, the NI coder and decoder for a case that the source data is constructed with 9bits characters are described.

The construction and operation of the NI coder are described as follows, referring to FIG. 4. The NI coder may be constructed by several structures, but it can be constructed like FIG. 4 to maintain the regularity and the symmetry of the inventive embodiment with a simple hardware structure.

An NI coding equipment is made up of a transition number calculator 401, an encoding type decoder 402 and a bit manipulator 303.

The transition number calculator 401 sums up the number of transitions in the pre-code.

The encoding type decoder 402 selects the transition number of the pre-code and the encoding type based on the NI coding rules according to an in-band signal, and generates a control signal.

The bit manipulator 403 selects an NI code type according to the in-band signaling or a special word signal SIG_IN, together with the encoding type decoder 401, then manipulates bits of the pre-code and generates the code word.

The construction and operation of the NI decoder are described as follows, with reference to FIG. 5.

The NI decoder may be constructed by several structures like the NI coder, but it can be constructed like FIG. 5 to maintain the regularity and the symmetry of the inventive embodiment with a simple hardware structure.

The frame synchronization or block synchronization are performed by a unique pattern detection which uses synchronization code characters among the inventive NI code words. Therefore, it is assumed that the code word input to the NI decoder was block-synchronized.

The NI decoder is composed of a transition number calculator 501, a decoding type decoder 502 and a bit manipulator 503.

The transition number calculator 501 computes the number of transitions (Nt) in the code word.

The decoding type decoder 502 generates a signal for selecting the decoding type based on the NI decoding rules, an in-band signaling or a special word SIG_OUT, and a code violation, according to the transition number (Nt) of the pre-code and a nibble inversion representation bit (NIIB), and then transmits it to the bit manipulator 503.

The bit manipulator 503 selects the NI decoding type according to the signals from the decoding type decoder 502, and manipulates bits of the code word to restore original characters.

As afore-mentioned, in accordance with the present invention, an encoding and decoding of a line code used in a transmission of data and in an interconnection system are provided. The present invention may be applicable to the system which transmit parallel source and in-band signal in serial at the speed of over giga bit. Herein, the line code gives high coding efficiency since only one redundancy bit is used in encoding, an easy clock recovery is possible since the inventive code guarantees rich transitions within a serial bit stream and provides various frame synchronization patterns with short bit stream.

In the invention, additionally, several numbers of frame synchronization code words are provided, in-band and ex-band signals are provided plentifully, and the basics of coding rules can be applied thereto as it is, even though a source data word is constructed by number of bits other than 8.

Further, the embodiment of this invention is simple since coding and decoding rules have symmetry and regularity, and the processing at low speed is possible since coding and decoding is on character basis.

It will be apparent to those skilled in the art that various modifications and variations can be made in the present invention without deviating much from the spirit or scope of the invention. Thus, it is intended that the present invention cover the modifications and variations of this invention provided they come within the scope of the appended claims and their equivalents.

What is claimed is:

1. A method for using a nibble inversion code in a network system, comprising the steps of:
   a) adding redundancy 1 bit to n bit source data where n is an even number of 2 or over to thereby generate a pre-code;
   b) calculating the number of transitions for the generated pre-code;
   c) determining the pre-code as a code word if the number of transitions in the pre-code is greater than or equal to 1+n/2 in the calculating result;

d) inverting partial bits (hereinafter, referred to as "nibble") of the pre-code, and generating as the code word, if the number of transitions in the pre-code is less than n/2 in the calculating result;

e) determining the pre-code as the code word in case that the number of transitions in the pre-code is equal to n/2 and simultaneously source data is not an in-band signaling and also not a special word in the calculating result; and f) inverting a nibble of the pre-code to thereby generate as the code word, in case that the number of transitions for the pre-code is equal to n/2 and simultaneously the source data is an in-band signaling or a special word in the calculating result.

2. The method as recited in claim 1, further comprising the step:

g) combining the code words in order for delineating a boundary of a block or a frame and constructing synchronization code words so as to make a unique synchronization pattern in an encoded serial bit stream.

3. A method for using a nibble (partial bits of word) inversion code in a network system to receive an encoded n bit source data where n is an even number of 2 or over, and decode the code word, said method comprising the steps of:

a) receiving an encoded code word and calculating the number of transitions in the code word;

b) recovering the source data from the bits except the redundancy bit in the code word, if the number of transitions in the code word is greater than or equal to 1+n/2 and simultaneously the redundancy bit is not inverted in a calculating result;

c) inverting a nibble of the code word and recovering the source data from the bits except the redundancy bit of the nibble-inverted code word, if the number of transitions in the code word is greater than or equal to 1+n/2 and simultaneously the redundancy bit is inverted in the calculating result;

d) recovering the source data from the bits except the redundancy bit of the code word if the number of transitions in the code word is equal to n/2 and simultaneously the redundancy bit is not inverted in the calculating result;

e) inverting the nibble of the code word, recovering the source data to the bits except the redundancy bit of the nibble inverted code word and representing that the decoded source data is an in-band signaling (or a special) word, if the number of transitions in the code word is equal to n/2 and simultaneously the redundancy bit is inverted in the calculating result; and f) representing the signal of code violation if the number of transitions in the code word is less than n/2 in the calculating result.

4. The method as recited in claim 3, further comprising the step of:

g) detecting a frame synchronization pattern in an encoded bit stream and performing the block or frame synchronization process.

5. A method for using a nibble (partial bits of word) inversion code in a network system, comprising the steps of:

a) adding 1 redundancy bit to n bit source data where n is an odd number of 3 or over to thereby generate a pre-code;

b) calculating the number of transitions for the generated pre-code;

c) determining the pre-code as the code word if the number of transitions in the pre-code is greater than or equal to (n+1)/2 in a calculating result;

d) inverting partial bits of the pre-code (hereinafter, referred to as "nibble") to thereby generate the code word, if the number of transitions in the pre-code is less than (n−1)/2 in the calculating result;

e) determining the pre-code as the code word in case that the number of transitions in the pre-code is equal to (n−1)/2 and simultaneously the source data is not an in-band signaling (nor special) word in the calculating result; and f) inverting the nibble of the pre-code to thereby generate the code word, in case that the number of transitions for the pre-code is equal to (n−1)/2 and simultaneously the source data is an in-band signaling (or a special) word in the calculating result.

6. The method as recited in claim 5, further comprising the step of:

g) combining the code words in order for delineating a boundary of a block or a frame and constructing synchronization code words so as to make unique synchronization pattern in an encoded serial bit stream.

7. A method for using a nibble (partial bits of word) inversion code in a network system to receive an encoded n bit source data where n is an odd number of 3 or over and to decode the code word, said method comprising the steps of:

a) calculating the number of transitions for the received code word;

b) recovering the source data from bits except redundancy bits in the code word, if the number of transitions in the code word is greater than or equal to (n+1)/2 and simultaneously the redundancy bit is not inverted in a calculating result;

c) inverting a nibble of the code word and recovering the source data from the bits except the redundancy bit of the nibble inverted code word, if the number of transitions in the code word is greater than or equal to (n+3)/2 and simultaneously the redundancy bit is inverted in the calculating result;

d) recovering the source data from the bits except the redundancy bit of the code word if the number of transitions for the code word is equal to (n−1)/2 and simultaneously the redundancy bit is not inverted in the calculating result;

e) inverting the nibble of the code word, recovering the source data from the bits except the redundancy bits of the nibble inverted code word and representing that the decoded source data is an in-band signaling (or a special) word, if the number of transitions in the code word is equal to (n+1)/2 and simultaneously the redundancy bit is inverted in the calculating result; and f) representing the signal of code violation if the number of transitions in the code word is less than (n−1)/2 in the calculating result.

8. The method as recited in claim 7, further comprising the step of:

g) detecting a frame synchronization pattern in an encoded bit stream and performing the block or frame synchronization process.

9. An apparatus for using a nibble (partial bits of word) inversion code to utilize a nibble inversion, comprising:

a first transition number calculating unit for summing up the number of transitions in a pre-code generated by adding 1 redundancy bit to source data;

an encoding type decoding unit for selecting an encoding type based on nibble inversion code rules according to an in-band signaling and the transition number of the pre-codes gained in said first transition number calculating unit and producing a control signal; and a first bit manipulating unit for selecting a nibble inversion code type according to the control signal of said encoding type decoding unit, manipulating bits of the pre-code and generating a code word.

10. The apparatus as recited in claim 9, further including:

a second transition number calculating unit for receiving the code word generated through a nibble inversion and computing the number of transitions in the code word;

a decoding type decoding unit for generating a signal which selects the transition number of the code word gained in said second transition number calculating unit, wherein the decoding type is based on decoding rules of the nibble inversion code according to a nibble inversion representation bit provided within the code word, the in-band signaling or a special word, and a code violation; and a second bit manipulating unit for manipulating bits of the code word through the selection signal transferred from said decoding type decoding unit and restoring original source data.

11. An apparatus for using a nibble (partial bits of word) inversion code to receive a code word generated through a nibble inversion and decode source data, said apparatus comprising:

a transition number calculating unit for computing the number of transitions in the received code word;

a decoding type decoding unit for generating a signal which selects the transition number of the code word gained in said second transition number calculating unit, wherein the decoding type is based on decoding rules of the nibble inversion code according to a nibble inversion representation bit provided within the code word, an in-band signaling or a special word and a code violation; and a bit manipulating unit for manipulating bits of the code word through a selection signal transferred from the decoding type decoding unit and restoring original source data.

* * * * *